(12) United States Patent
Schleupen et al.

(10) Patent No.: US 6,913,006 B2
(45) Date of Patent: Jul. 5, 2005

(54) HIGH-FREQUENCY IGNITION SYSTEM FOR AN INTERNAL COMBUSTION ENGINE

(75) Inventors: Richard Schleupen, deceased, late of Ingersheim (DE); by Dagmar Schleupen, legal representative, Ingersheim (DE); by Gerd Schleupen, legal representative, Ingersheim (DE); by Kai Schleupen, legal representative, Yorktown Heights, NY (US); by Elke Cardeneo, legal representative, Düsseldorf (DE); by Astrid Maute, legal representative, Boulder, CO (US); Thomas Wizemann, Ludwigsburg (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 10/466,946

(22) PCT Filed: Oct. 24, 2002

(86) PCT No.: PCT/DE02/04000
§ 371 (c)(1),
(2), (4) Date: Jan. 14, 2004

(87) PCT Pub. No.: WO03/046374
PCT Pub. Date: Jun. 5, 2003

(65) Prior Publication Data
US 2004/0112350 A1 Jun. 17, 2004

(30) Foreign Application Priority Data
Nov. 21, 2001 (DE) .......................... 101 57 029

(51) Int. Cl.[7] .............................. F02P 7/10; F02P 15/10
(52) U.S. Cl. ................ 123/606; 123/143 B; 123/143 C
(58) Field of Search ............................ 123/606, 143 B, 123/143 C

(56) References Cited

U.S. PATENT DOCUMENTS

| 3,934,566 | A | * | 1/1976 | Ward .......................... 123/606 |
| 4,446,826 | A | * | 5/1984 | Kimura et al. ............... 123/606 |
| 4,561,406 | A | * | 12/1985 | Ward .......................... 123/606 |
| 5,049,843 | A | * | 9/1991 | Barnes et al. ............... 333/246 |
| 5,361,737 | A | | 11/1994 | Smith et al. |
| 6,138,653 | A | * | 10/2000 | Juffinger ...................... 123/598 |
| 6,357,426 | B1 | * | 3/2002 | Schleupen ................... 123/606 |
| 6,581,581 | B1 | * | 6/2003 | Bebich ........................ 123/536 |
| 2004/0123851 | A1 | * | 7/2004 | Schmidt et al. ............. 123/606 |

FOREIGN PATENT DOCUMENTS

| DE | 25 43 125 | 9/1975 |
| DE | 35 27 041 | 2/1987 |
| DE | 198 52 652 | 5/2000 |
| DE | 100 15 612 | 10/2001 |
| DE | 100 15 613 | 10/2001 |
| EP | 0 242 839 | 8/1992 |
| GB | 2 080 877 | 2/1982 |
| WO | 91/00961 | 1/1991 |

OTHER PUBLICATIONS

Bonazza et al.; "RF Plasma Ignition System Concept for Lean Burn Internal Combustion Engines"; Energy Systems, New Technologies, San Diego, Aug. 3–7, 1992, Proceedings of the Intersociety Energy Conversion Engineering Conference (IECEC), NY, IEEE, US; pp. 4315–4319.

* cited by examiner

Primary Examiner—Erick Solis
(74) Attorney, Agent, or Firm—Kenyon & Kenyon

(57) ABSTRACT

A high-frequency ignition system has a waveguide and a high-frequency amplifier. In this context, the high-frequency amplifier is situated at a first end of the waveguide. An ignition gap is situated at a second end of the waveguide. Additionally provided is a positive-feedback element, by which the frequency of the high-frequency amplifier is adapted to the load conditions of the waveguide and the ignition gap.

6 Claims, 1 Drawing Sheet

HIGH-FREQUENCY IGNITION SYSTEM FOR AN INTERNAL COMBUSTION ENGINE

BACKGROUND INFORMATION

A high-frequency ignition system is described in German Patent No. DE 198 52 652, where a waveguide and a high-frequency amplifier are provided. The one end of the waveguide projects into the combustion chamber of an internal combustion engine and thereby forms an ignition gap. The high-frequency amplifier is connected to the other end of the waveguide. When a suitable high-frequency signal is generated by the high-frequency amplifier, sparks are generated in the ignition gap, which are used to ignite a combustible mixture in a cylinder of an internal combustion engine.

SUMMARY OF THE INVENTION

The high-frequency ignition system of the present invention has the advantage over the related art, that a positive-feedback element is provided, by which the frequency of the high-frequency amplifier is adjusted to the load conditions of the waveguide. This measure allows an ignition spark to be reliably generated in all operating states. This also applies, in particular, to the case in which a spark is already burning at the ignition gap, because this leads to a change in the load conditions of of the waveguide.

It is particularly easy for the high-frequency amplifier to take the form of a transistor, in particular a field-effect transistor. The positive feedback may especially take the form of inductive, positive feedback or inductive and capacitive, positive feedback. For inductive, positive feedback, a coaxial conductor may be positioned in the region of the magnetic field of the waveguide. When the positive feedback is achieved in an inductive and capacitive manner, the waveguide is designed as a coaxial element in a particularly simple manner, the positive-feedback element being formed in an especially simple manner by a conductor which is positioned in parallel with the center conductor inside the shielding.

DETAILED DESCRIPTION

Figure 1:
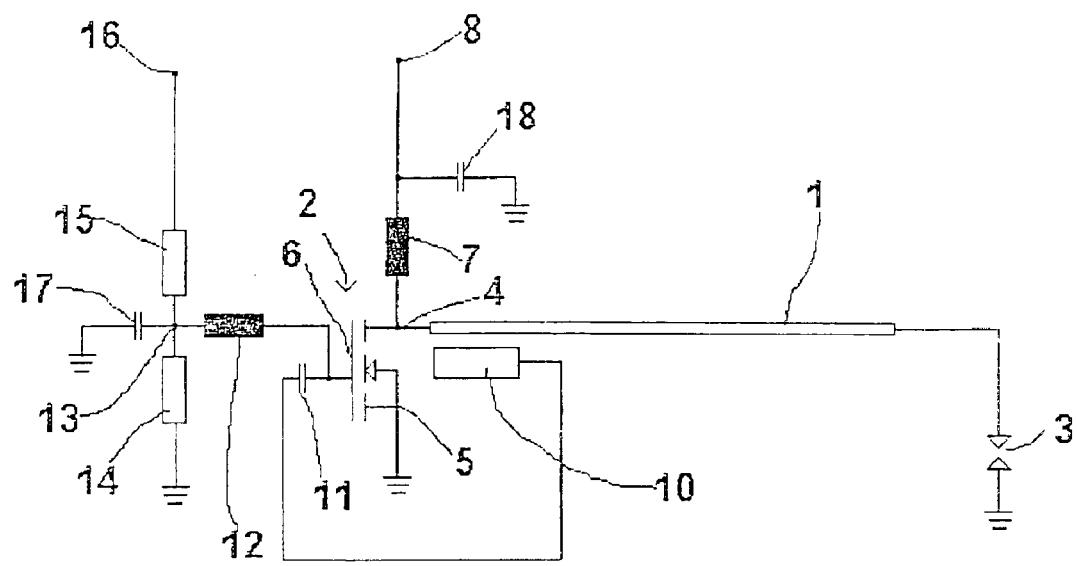
FIG. 1 shows a first schematic view of the high-frequency ignition system according to the present invention, the positive feedback being schematized in bold-face.

A schematic view of a high-frequency ignition system according to the present invention is shown in FIG. 1. The high-frequency ignition system has a waveguide 1, at whose one end an ignition gap 3, in particular a spark plug, is situated. The spark plug projects into the combustion chamber (cylinder) of an internal combustion engine, in particular a gasoline engine, and is used to ignite a combustible mixture of air and fuel (gasoline) situated in the combustion chamber. A high-frequency amplifier 2, which, in this case, takes the form of a field-effect transistor, is shown at the other end of waveguide 1. The entire set-up of high-frequency amplifier 2 and waveguide 1 forms a high-frequency generator, by which a high-frequency signal may be generated. The field-effect transistor is connected by a drain terminal 4 to a first end of a waveguide 1. In addition, field-effect transistor 2 has a source terminal 5 that is connected to ground. Field-effect transistor 2 also has a gate terminal 6.

By applying a positive voltage, the gate may be switched to be conductive, i.e. current is allowed to flow between drain 4 and source 5. Source 5 is connected to a grounding terminal. Drain 4 is connected to a voltage terminal 8 via a choke coil 7.

When a high-frequency control signal is applied to the gate, then a high-frequency signal is generated on the wave guide 1. If, in this context, the frequency of the high-frequency signal is optimally adjusted to the load conditions of waveguide 1 or of any lead that follows it (is adjacent to it) and leads to ignition gap 3, then a high-frequency signal having very high voltages is generated in ignition gap 3. These voltages are so high that a spark jumps in ignition gap 3, from waveguide 1, across ignition gap 3, to ground. The voltages necessary for this are on the order of several thousand Volts.

The present invention now provides that these high-voltage sparks be used for the ignition of an internal combustion engine. In this context, it should be taken into consideration, however, that the load conditions of waveguide 1 change at the instant a spark jumps at ignition gap 3, between waveguide 1 and the grounded connection, for the transformation ratios of the waveguide are also a function of the resistance that the ignition gap has with respect to ground. This resistance is very large before a spark jumps. However, an ionized gas having a certain conductivity is generated by the spark in the ignition gap. This ionized gas results in waveguide 1 being terminated by a finite resistance at the end opposite to high-frequency amplifier 2. This has an effect on the transformation ratios of waveguide 1. The frequency adjustment and, therefore, the generation of a high-voltage signal, as well, may only be maintained when high-frequency amplifier 2 reacts to this change in the terminal resistance of waveguide 1, using a corresponding change in frequency.

The present invention now provides that this frequency adjustment be accomplished by a positive-feedback element 10. In FIG. 1, this positive-feedback element is only shown schematically. Specific, technical, exemplary embodiments of this positive-feedback element are then shown in FIGS. 2 and 3. In FIG. 1, positive-feedback element 10 is therefore only schematically represented as a block, without going into detail about the exact functioning of this positive-feedback element.

Positive-feedback element 10 is connected to gate 6 of high-frequency-generating transistor 2 via a corresponding line and a decoupling capacitor 11. In addition, gate 6 of transistor 2 is connected to a tap 13 of a voltage divider via a choke coil 12. The voltage divider has a first resistor 14 between tap 13 and the grounded connection. A second resistor 15 is situated between tap 13 and a signal terminal 16. In addition, tap 13 is connected to ground via a bypass capacitor 17.

The ignition device constructed in such a manner functions as follows. A square-wave signal, whose duration corresponds to the desired duration of the spark, is applied to signal terminal 16. Therefore, the duration of the signal applied to terminal 16 is on the order of a few milliseconds. If a positive voltage is applied to terminal 16, then tap 13 is also set to a positive voltage, whose value is a function of the voltage at signal terminal 16 and a function of first and second resistances 14 and 15. This positive potential is supplied to gate terminal 6 via choke coil 12.

If no voltage is applied to gate terminal 6, then transistor 2 is non-conductive, so that the supply voltage provided at terminal 8 is present at drain 4 and, therefore, at the first end of waveguide 1, as well.

If a positive voltage is now applied to drain 4 due to the signal at signal terminal 16, then transistor 2 is switched to be conductive and drain 4 draws current. Using the noise signal, the circuit is preferably coupled back to gate 6 via positive-feedback element 10, in the range of lowest attenuation (resonance). Using this positive feedback, the gate is therefore activated at the frequency that results in the greatest current amplitudes and voltage amplitudes on waveguide 1.

Due to the positive feedback, high-frequency amplifier 2 is therefore set to the frequency which is optimally adjusted to the source resistance and the load of wave guide 1 (resonance). When the potential difference between wave guide 1 and the grounded connection is then sufficiently large in ignition gap 3, a spark is formed, i.e. energy flows from waveguide 1, across ignition gap 3, to ground. Since ionized gas accumulates in ignition gap 3, i.e. in the spark plug in the combustion chamber of an internal combustion engine, wave guide 1 is connected to ground by a finite resistance, via ignition gap 3. Due to this change in the resistance at the ignition-side end of waveguide 1, either the length of waveguide 1 or the frequency of high-frequency amplifier would have to be changed for maintaining resonance, in order to still ensure an optimum adaptation to the load. Only under this condition may a voltage large enough to form a spark in ignition gap 3 be provided at the ignition-side end of waveguide 1. The overall circuit arrangement allows the frequency of high-frequency amplifier 2 to be adjusted automatically to the frequency, at which the attenuation is lowest and, therefore, the power adjustment is best.

Therefore, this device of the present invention ensures that the frequency of high-frequency amplifier 2 is automatically adjusted to the load conditions at the ignition-side end of waveguide 1. This frequency adjustment brings about an optimal load adaptation when the device is switched on, and when a spark jumps in ignition gap 3. In this manner, it is ensured that a spark burns in ignition gap 3 during the entire period of time in which a corresponding control signal is provided at terminal 16.

Shown in FIG. 1 is a plurality of elements, which allow the waveguide to be coupled to and decoupled from other voltages with respect to frequency. Decoupling capacitor 11 ensures that only a.c. voltages are coupled back to gate 6 by positive-feedback element 10. Therefore, capacitor 11 represents a high-pass filter. In this manner, the d.c. voltage applied to gate 6 is prevented from being influenced by the resistance of positive-feedback element 10. Choke coil 7 is not only connected to voltage supply 8, but also to ground via a capacitor 18. Choke coil 7 and bypass capacitor 18 are used, here, as a low-pass filter, in order to prevent the HF signal on waveguide 1 from being coupled into voltage supply 8. Choke coil 12 and capacitor 17 correspondingly act as a low-pass filter, in order to reduce the coupling of the HF signal at the gate to signal terminal 16. As voltage dividers, resistors 14 and 15 are used to adapt the signal applied to terminal 16 to the triggering (driving) range of transistor 2.

Figure 2:
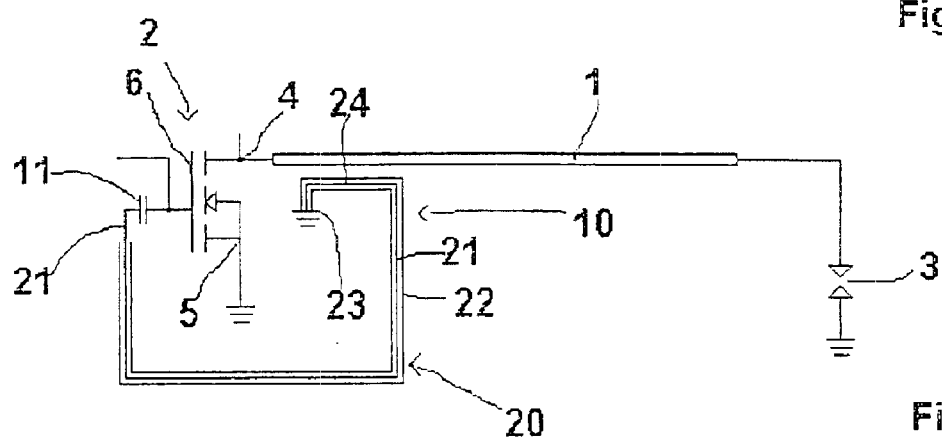
FIG. 2 shows a first exemplary embodiment of the positive feedback.

The embodiment of a positive-feedback element 10 is shown in detail in FIG. 2. Reference numerals 1, 2, 3, 4, 5, 6, and 11 again designate the same objects as in FIG. 1, these objects also fulfilling the same functions as described in FIG. 1. In this case, waveguide 1 especially takes the form of a strip waveguide. Here, positive-feedback element 10 is designed as a coaxial line 20 having a center conductor 21 and outer shielding 22. One end 23 of coaxial line 20 is connected to ground. In this context, inner conductor 21 and shielding 22 are connected to ground. Starting out from end 23, a coupling region 24 of coaxial line 20 extends in parallel to waveguide 1. In this context, end 23 is adjacent to drain terminal 4 of waveguide 1, so that, starting out from end 23, coupling region 24 extends away from drain terminal 4, along waveguide 1, to ignition gap 3. After coupling region 24, coaxial line 20 is lead away from waveguide 1 in a direction essentially perpendicular to it, and subsequently a long distance from it.

The effect of this device is such that, due to the parallel configuration of coupling region 24, it lies in the region of the magnetic field of waveguide 1. Therefore, a high-frequency signal on waveguide 1 generates a corresponding voltage signal on center conductor 21 in the area of coupling region 24. This form of coupling is referred to as inductive coupling, since it is generated by the magnetic field of the HF signal on waveguide 1. Since coaxial line 20 is situated relatively far away from waveguide 1, except for in coupling region 24, a correspondingly induced signal may also be neglected in these regions. In essence, coupling only occurs in coupling region 24.

The phase angle of the signal acquired in this manner is such that the signal produces positive feedback, i.e. amplifies the high-frequency signals applied to waveguide 1. In this context, the high-frequency signals having the greatest signal amplitudes on waveguide 1, i.e. the high-frequency signals optimally adapted to the load conditions of waveguide 1 with respect to frequency, are especially amplified. This is produced by carrying the signal induced in coupling region 24 through center conductor 21 to gate 6 of transistor 2. A control signal at signal terminal 16 raises the voltage at gate 6 of field-effect transistor 2 high enough to allow a specific flow of current from drain 4 to source 5. The positive feedback provides an additional control voltage at gate 6 as a function of frequency, the additional control voltage further biasing transistor 2 into conduction. In this context, the additional, positively fed-back signal is frequency-dependent and causes field-effect transistor 2 to be driven at the frequency which is optimally adjusted to the load conditions of waveguide 1. The form of inductive, positive feedback shown in FIG. 2 is particularly simple when the waveguide takes the form of a strip waveguide.

Figure 3:
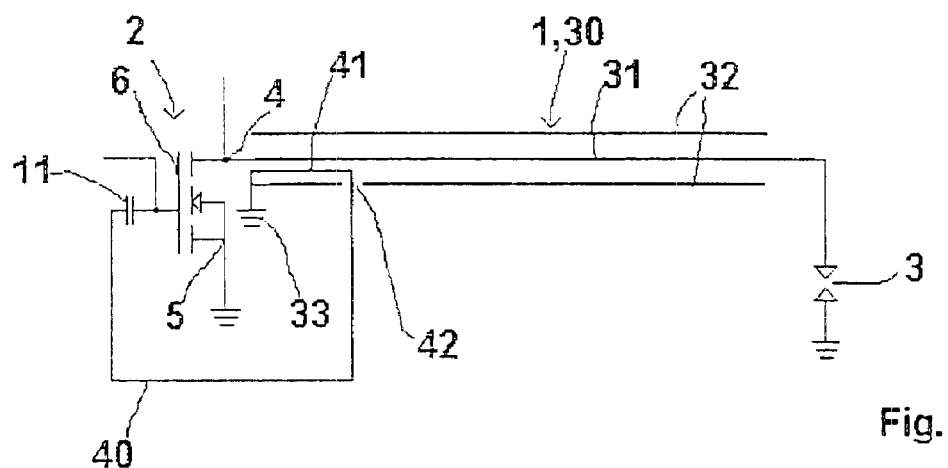
FIG. 3 shows a further exemplary embodiment of the positive feedback.

FIG. 3 shows a further exemplary embodiment of the positive feedback according to the present invention. Reference numerals 1, 2, 3, 4, 5, 6, and 11 again designate the same objects as in FIG. 1, these objects also fulfilling the same functions as described in FIG. 1. However, in this case, waveguide 1 takes the form of a coaxial waveguide 30 having an inner conductor 31 and shielding 32. At the end adjacent to drain terminal 4, shielding 32 is connected to a grounding terminal 33. Here, the positive feedback is produced by a conductor 40. Conductor 40 is connected to gate terminal 6 on one end, and to grounding terminal 33 on the other end. Starting out from grounded connection 33, conductor 40 extends in a coupling region 41, parallelly to inner conductor 31. In addition, coupling region 41 is situated inside shielding 32 of coaxial conductor 30. Starting out from drain terminal 4 of coaxial conductor 30, coupling region 41 of conductor 40 extends a short distance in the direction of ignition gap 3, in parallel to inner conductor 31, and it then exits the interior of coaxial conductor 30 through opening 42 of shielding 32 and is led back to gate 6.

A so-called capacitive and inductive, positive feedback is produced by the parallel arrangement of a part of conductor 40 in coupling region 41 parallel to inner conductor 31. This means that the voltage signal is produced on conductor 40 by the magnetic field of inner conductor 31, and also by the electrical voltages occurring there.

The advantage of purely inductive, positive feedback is a simple design and the fact that no falsifying, capacitive component is present. The mixed inductive and capacitive, positive feedback is a function of the direction of travel of the energy and represents directional coupling.

The function of the positive feedback according to FIG. 3 once again corresponds to the function as previously described for FIG. 2. When a signal is applied to signal terminal 16, field-effect transistor 2 is brought into a state in which it allows a certain flow of current between drain 4 and the source. A positive-feedback signal, which provides an additional voltage at gate 6, is generated in coupling region 41 of conductor 40. This positive-feedback signal is particularly strong when it has the HF-signal frequency optimally adjusted to the load conditions of coaxial conductor 30, and thus brings about triggering at this frequency of field-effect transistor 2. The effect is, that field-effect transistor 2 is always driven at the frequency which generates a maximum voltage in ignition gap 3. Above all, this also works when the firing of a spark in ignition gap 3 causes a change in the terminal resistance and, thus, in the wave impedance of waveguide 1 as well, which takes, in this case, the form of a coaxial conductor 30.

What is claimed is:

1. A high-frequency ignition system for an internal combustion engine comprising:

a waveguide having a first end and a second end, the waveguide further having a length;

a high-frequency amplifier situated at the first end of the waveguide;

an ignition gap situated at the second end of the waveguide; and a positive-feedback element with which the waveguide and the high-frequency amplifier form, together, a high-frequency generator, the high-frequency generator oscillating at a frequency at which an attenuation determined by the length and load conditions of the waveguide is lowest, the high-frequency generator generating a high-frequency signal resulting in a spark in the ignition gap.

2. The ignition system according to claim 1 wherein the amplifier includes a field-effect transistor.

3. The ignition system according to claim 1, wherein the positive-feedback element has inductive, positive feedback with respect to the waveguide.

4. The ignition system according to claim 3, wherein the positive-feedback element includes a coaxial conductor, the coaxial conductor having a coupling region which extends in parallel to the waveguide, in a region of a magnetic field of the waveguide.

5. The ignition system according to claim 1, wherein the positive-feedback element is an inductive and capacitive, positive-feedback element.

6. The ignition system according to claim 5, wherein the waveguide includes a coaxial conductor having a center conductor and shielding, and the positive-feedback element has a coupling region, the coupling region having a conductor which extends in parallel to the center conductor inside the shielding.

* * * * *